US011829199B1

(12) United States Patent
Srowig et al.

(10) Patent No.: US 11,829,199 B1
(45) Date of Patent: Nov. 28, 2023

(54) TIMING GENERATOR AS MASTER CLOCK FOR AN ELECTRONIC CIRCUIT

(71) Applicant: ELMOS SEMICONDUCTOR SE, Dortmund (DE)

(72) Inventors: André Srowig, Heidelberg (DE); Fabian Finkeldey, Bruchsal (DE)

(73) Assignee: ELMOS SEMICONDUCTOR SE, Dortmund (DE)

( * ) Notice: Subject to any disclaimer, the term of this patent is extended or adjusted under 35 U.S.C. 154(b) by 0 days.

(21) Appl. No.: 18/207,437

(22) Filed: Jun. 8, 2023

(30) Foreign Application Priority Data

Jun. 10, 2022 (DE) ..................... 10 2022 114 625.1

(51) Int. Cl.
*G06F 1/08* (2006.01)
*G06F 1/14* (2006.01)

(52) U.S. Cl.
CPC . *G06F 1/08* (2013.01); *G06F 1/14* (2013.01)

(58) Field of Classification Search
CPC ...................................... G06F 1/08; G06F 1/14
See application file for complete search history.

(56) References Cited

U.S. PATENT DOCUMENTS

| | | | | |
|---|---|---|---|---|
| 8,887,020 | B2* | 11/2014 | Shokrollahi | H03M 13/3761 714/755 |
| 2008/0002801 | A1* | 1/2008 | Droege | H03L 7/113 375/375 |
| 2008/0148119 | A1* | 6/2008 | Huang | G06F 11/27 714/E11.169 |
| 2010/0085093 | A1* | 4/2010 | Van Der Wel | H03L 7/0812 327/276 |
| 2019/0052280 | A1 | 2/2019 | Perez | |
| 2021/0044299 | A1 | 2/2021 | Tertinek | |
| 2022/0100247 | A1* | 3/2022 | Garg | G06F 1/3203 |
| 2022/0303929 | A1* | 9/2022 | Chowdhury | H04L 7/0033 |
| 2022/0345147 | A1 | 10/2022 | Hsia et al. | |
| 2022/0390903 | A1* | 12/2022 | Myers | H03L 7/0818 |

OTHER PUBLICATIONS

Jan. 26, 2023 Office Action issued in German Patent Application No. 10 2022 114 625.1.
Apr. 13, 2023 Decision to Grant a Patent issued in German Patent Application No. 10 2022 114 625.1.

* cited by examiner

*Primary Examiner* — Aurel Prifti
(74) *Attorney, Agent, or Firm* — Oliff PLC (57) ABSTRACT

A timing generator as master clock for an electronic circuit includes a coarse code and a plurality of fine codes, has a ring oscillator with an uneven number n of delay elements, each of which has a delay output at which clock signal is present; clock dividers which are connected to the delay outputs and at whose output a clock divider output signal is output; start circuit for generating initialization signal to trigger clock dividers, and clock generator that further processes clock signal and generates a coarse code, and an output at which generated timestamp is output, wherein the fine codes of timestamp are formed from clock divider output signals of the clock dividers, and the coarse code and the fine codes contain redundant information that a time shift of the fine codes relative to the coarse code by at most (n−1)/2 time differences results in a correct timestamp.

22 Claims, 5 Drawing Sheets

TIMING GENERATOR AS MASTER CLOCK FOR AN ELECTRONIC CIRCUIT

The present invention relates to a timing generator as master clock for an electronic circuit, wherein the timing generator is designed and constructed to generate a timestamp. The invention also relates to a method for generating a timestamp for an electronic circuit.

Electronic circuits typically require a master clock or timing generator that provides high-precision clock signals or time signals to synchronize individual modules in the electronic circuits. For example, in sensor circuits or distance measurements such as are used in motor vehicles and the automotive sector, propagation times are calculated for signals so that distances between objects can be determined therefrom, or the environment around a vehicle can be detected. In this context, it is important to measure the time very precisely.

In order to provide a precise timecode or clock pulse, synchronous electronic circuits that operate at high clock frequencies are often used. Such circuits are typically expensive, prone to malfunction and rather unstable. They are also often unsuitable for use in the automotive sector, despite the fact that the high clock frequencies would enable good resolution in distance measurement.

Alternatively, timing generators working according to the classical Vernier schema may be used; this allows high resolution time-to-digital conversion. However, scaling of such a timing generator to many channels is only possible to a limited extent, which means that a large number of timing generators is required for high-resolution systems with many parallel channels. This in turn considerably increases space requirement and power consumption. For this reason, such a use in the automotive sector is not envisioned, particularly when an autonomous or semiautonomous driving mode is to be realized on the basis of the distance measurements and detections of the environment.

Therefore, there is an urgent need for a timing generator that can provide time signals in the single-digit nanosecond range and the picosecond range with a very slow technology and low clock frequencies of less than 300 MHz. At the same time, the time signal generated should have a low error-rate and be robust.

The present object is solved with a timing generator having the features of claim 1, and with a method for generating a timestamp as master clock for an electronic circuit having the features of claim 20.

Preferred embodiments of the invention are described in the dependent claims. It is understood that the features described in the preceding text and those that will be explained below can be used not only in the combinations in which each is presented, but also in other combinations or alone, without departing from the scope of the present invention. In particular, the method may be configured to correspond to the embodiments of the apparatus described in the dependent claims.

According to a first aspect, the present invention relates to a timing generator as master clock for an electronic circuit. The timing generator is arranged and configured to generate a timestamp. The timestamp comprises a coarse code and a plurality of fine codes. The coarse code is also called the coarse portion, the fine code as the fine portion.

According to the invention, the timing generator comprises a ring oscillator with an uneven (odd) number n of delay elements or delay members, each of which has a delay output. A clock signal is present at the delay output of the delay elements. Each of the delay elements is adjusted to a preset delay time by the ring oscillator.

The timing generator comprises a clock divider which is located at a delay output of the ring oscillator and is connected thereto in such a manner that each delay output is connected to a clock divider. The one or more clock dividers have a clock divider output, where a clock divider output signal is output. The clock divider output signals form the fine codes of the timestamp that is generated by the timing generator.

The timing generator further comprises a start circuit for generating an initialization signal. The initialization signal is sent to the clock dividers to trigger the clock dividers. Triggering places the clock divider output in a defined state and maintains it there. This enables, for example, an asynchronous reset for the clock dividers, such as is needed in some technical applications.

The timing generator comprises a clock generator, which is connected to a delay output of the ring oscillator and receives the clock signal that is present at the delay output, then processes it further to generate the coarse code of the timestamp therefrom.

One output of the timing generator serves to output the timestamp that is generated in the timing generator. Thus, the timestamp is present at the output of the timing generator and includes the coarse code and the one or more fine codes. The timestamp is thus available to other circuits or modules on a circuit board or electronic circuit.

The timestamp is generated from the fine codes and the coarse code, and thus comprises the generated fine codes and the generated coarse code. The timestamp may be generated for example by merging the fine codes, that is to say the clock divider output signals, and the coarse code generated in the clock generator, that is to say the output signal from the clock generator. This may take place, for example, ahead of the output or immediately before the output, or even in the output itself.

The dock divider output signals generated in the dock divider are designed such that the dock divider output signals of two dock dividers are shifted by a time difference with respect to each other. The time difference may preferably correspond to a value obtained by dividing the system dock by twice the number of delay elements in the ring oscillator. The time difference between two dock divider outputs, that is to say the time difference of the fine codes, is dependent on the number n of delay elements in the ring oscillator and on the delay time of the delay elements.

The timestamp and the coarse code and fine codes contained therein are designed in such a manner that the coarse code and the fine codes include redundant information. The information is redundant in such a manner that a time offset of the fine codes with respect to a coarse code of not more than $(n-1)/2$ time differences always results in a correct timestamp. The timecode, a combination of coarse code and fine code, with i states of the fine code and j states of the coarse code is mapped to $i*j/2$ timestamps by a suitable decoder. The coarse and fine code states thus together contain more information than the decoded timestamp. Some of the information contained in the states of the fine code is also contained in the states of the coarse code. This redundancy of information is used to assign a unique fine code state and two alternative unique coarse code states to each state of the timestamp. In this way, a phase difference between coarse and fine code can be detected and corrected through the redundant information. The information included in the timecode may define a time point, for example, preferably a time point $T_n$, relative to a time point $T_0$. In a lidar system, for example, $T_0$ may be the time point when a light pulse is emitted, and $T_n$ the time point when the reflected light pulse is received.

One advantage of the present invention is that the timing generator generates a timestamp that is also suitable for circuits with asynchronous latching, and consequently can also be used for digital circuits that require buffering of codes. The timestamp generated is unique and can also be used in circuits in which the timestamp is used in more than just one unit, for example a chip or an ASIC. With processing elements that are spatially located close to each other in such a manner, within a chip or an ASIC, for example, time delays that arise between coarse code and fine code can be processed without errors. But the timestamp generated with the timing generator according to the invention is also suitable for use even when the timestamp must be distributed over long distances within an integrated circuit, as is required in high-resolution multichannel time-to-digital converters (TDCs), for example. In such circuits, a timestamp is provided for shared use by all channels of the time-to-digital converter. Such circuits also enable asynchronous operation, and can therefore be used with technologies relying on low clock frequencies of less than 500 MHz, preferably less than 300 MHz, particularly preferably less than 250 MHz. However, rapid processing of many optical events that occur simultaneously or in very rapid succession is still possible. The optical events can be processed at a frequency of 1 GHz and more, even though the circuit technology and the system clock used is in the range of a few 100 MHz, for example not more than 200 MHz.

Electronic circuits with multichannel time-to-digital converters with high time resolution, in which one common timestamp is used for all channels represent a highly efficient architecture. At the same time, however, this requires considerable requirements on the phasing between the coarse code and the fine code of the timestamp. These requirements are met by the timing generator according to the invention through redundant information in the fine code (fine portion), so that the efficient architecture can be implemented with high time resolutions as well. A further requirement, according to which only 1 bit in the code (binary code) changes from one timestamp to the following timestamp is not necessarily fulfilled. But the redundant information of the composite timestamp allows asynchronous scanning of the timestamp with a maximum of one time step error. Thus, the timestamp can also be used in asynchronous circuits.

An essential element of the solution is the ring oscillator, which generates an uneven (odd) number of n phase-shifted clock signals. Each of these signals is reduced, preferably to half the frequency, by a clock divider or a frequency divider, thus generating n phase-shifted clock divider output signals (fine code). These signals represent the fine portion of the timestamp. Thus, a signal from the ring oscillator is used to control and trigger a digital counter, which in turn is used preferably to clock the coarse code (coarse portion) of the timestamp. Consequently, the fine code runs with the double period compared with the classic Vernier schema. The fine code also contains information of the lowest-value bit of the coarse code, which represents the redundant component for correcting a phase offset. With an optional decoder circuit, each of two possible values of a coarse code in conjunction with a unique fine code value can thus yield one correspondingly decoded value. Consequently, a phase difference for example up to the size of a period can be tolerated.

A preferred embodiment of the timing generator according to the invention provides that the clock generator comprises a synchronous module, a clock-gate module, a counter and a Gray code generator. The synchronous module is preferably connected to one of the delay output signals.

Preferably, $2^m$ (2 to the power of m) Gray codes are generated in the Gray code generator, wherein m is a natural number. In a particularly preferred embodiment, the Gray code generator generates $2^{(n-1)}$ (2 to the power of (n−1)) Gray codes. In the case that the ring oscillator comprises for example seven delay members or delay elements, the Gray code generator preferably generates $2^6$, that is to say 64 Gray codes.

The counter in the clock generator—also called the Gray code counter—is preferably located before the Gray code generator. The counter is a clocked digital counter. It switches to the next state with each clock pulse. The counter is preferably a standard digital counter, so the switching time is linked to the technology used for the standard digital circuit. For example, if 350 nm technology is used, the counter can switch at a maximum of 200 MHz. This corresponds to an increment of 5 ns for the timestamp. To obtain a higher resolution, the clock pulse for the Gray code counter can be generated from the ring oscillator, which is preferred, as the clock generator is connected to one of the delay outputs of the ring oscillator and is supplied with the ring oscillators clock signal. The ring oscillator preferably has the useful property of generating n phase-shifted pulses in the case of n delay elements. The phase difference of the pulses corresponds to the period p divided by the number of delay elements n, that is to say p/n. Thus, in the present case, with a 350 nm technology and a system clock of 200 MHz corresponding to a 5 ns increment divided by 7 elements, this results in an increment of 715 picoseconds. This increment corresponds to the time difference between two delay elements of the ring oscillator.

Since the Gray code generator preferably generates $2^{(n-1)}$ Gray codes, the timestamp consequently has an (n−1)-bit coarse code and an n-bit fine code, which can be distributed over the entire integrated module and over the entire subsequent circuit, for example for direct runtime measurement in lidar systems. For example, the timestamps that comprise $2^{(n-1)}$ bits can be used for generating an address for a memory or latch module such as may be used for example in an asynchronous SRAM control circuit for capturing runtimes of a lidar system.

A preferred embodiment provides that the coarse code comprises a Gray code which is generated by means of the Gray code generator.

The timing generator is preferably designed in such a manner that the period of the fine code is equal to half the cycle length of a Gray code. Thus, for example, a fine code has state 0 for the cycle length of one Gray code, and switches to state 1 when the Gray code changes, wherein the state 1 is retained for the duration of the second Gray code. Thus, the Gray code changes its state after the fine code has run through half of its 2*n states.

In a preferred embodiment of the timing generator, the clock-gate module of the clock generator is initiated, i.e. started, by means of a switching signal. The switching signal is preferably a start-of-measurement signal, which initiates the generation of a sequence of timestamps. Thus, in a time-of-flight measurement, the start-of-measurement signal or switching signal starts the measurement, for example, so that the first timestamp is generated at time point t0, preferably timestamp 0, that is to say a timestamp in which both the Gray code and all fine codes have the value 0. Accordingly, the switching signal that initiates the clock-date module is used to synchronize the coarse code with the fine code. This preferably applies not only at the start of a measurement. The synchronization of coarse code and fine code preferably takes place immediately upon receipt of the start signal, that is to say when the start signal is present at the clock-gate module of the clock generator. The operation can be initiated multiple times.

In a preferred embodiment, the clock-gate module comprises a flip-flop module, preferably a synchronous flip-flop module. The (synchronous) flip-flop module is particularly preferably linked to a logical OR-gate.

A preferred embodiment provides that the synchronous module of the clock generator comprises a flip-flop module and an inverter module; wherein the initialization signal for the clock generator is preferably transmitted to the synchronous module.

In a preferred embodiment, the timing generator is designed in such a manner that the generated timestamp may be sampled at any point in time. Particularly preferably, the correct time value of the timestamp is captured upon sampling, wherein the timestamp can be detected with a maximum error of one time step. A suitable decoder is preferably used to detect the correct time value (timestamp).

Preferably, the timestamp with the maximum error can be sampled even when the value of a coarse code or the value of a fine code or the value of both codes changes from one state to the next state. Errors can occur when the states of coarse code and/or fine code change, for example because one of the codes has already changed, but the other has not yet changed. In this way, a "false" binary code is created, which may comprise the value of a plurality of bits, even though only 1 bit in the coarse code and/or fine code has changed. But with the redundant information in the time code, a suitable decoder can still assign the correct binary value with a maximum time step error from a timestamp sampled at any point in time. Especially if a bit of the coarse code and a bit of the fine code change simultaneously.

A preferred embodiment of the timing generator provides that the timestamp is sampled by at least one flip-flop. Sampling is preferably done by a plurality of flip-flops, particularly preferably by n+m flip-flops, wherein n is the number of delay elements and m is the number of Gray codes of the coarse code. Preferably, m=n−1, which means that a total of 2n−1 flip-flops can be used for sampling.

In a preferred embodiment, the delay elements of the ring oscillator are adjusted to the predetermined delay time with a control voltage. Preferably, two control voltages are used. This reference clock is preferably lower than the system clock of the ring oscillator. Particularly preferably, the reference clock is extremely precise (deviation≤±1%) and is generated externally. For example, a phase-locked loop circuit (PLL circuit) may be used to generate both control voltages, so that the ring oscillator as a whole can be adjusted to the correct frequency. For example, the reference clock for the control voltages may be 1 MHz with a deviation of ±1%.

The start circuit of the timing generator preferably includes a memory module or flip-flop module or a bistable multivibrator circuit. The start circuit particularly preferably has two flip-flop modules connected in a series. Equally preferably, the start circuit may have exactly one memory module for each clock divider for the fine code.

In a preferred embodiment, the start circuit is initiated or switched by a start signal. The start circuit only begins working with the start signal. The start signal is preferably generated only when the ring oscillator has reached a defined frequency, at which it operates. Only then is the start circuit activated by the start signal and generates the initialization signal for the clock dividers.

The start circuit preferably generates an initialization signal for each clock divider, wherein the initialization signals have a fixed phasing with respect to the clock pulse of the clock divider.

In a preferred embodiment, a plurality of initialization signals are generated, preferably in a defined sequence, in such a manner that the phase relationship between the clock dividers is always identical. The start circuit is particularly preferably designed so that the initialization signals are such that the phase relationship between the clock dividers is identical, and independent of the state of the ring oscillator at the time point of the start signal for the start circuit. In this way, an independent initialization signal can be generated for the ring oscillator.

In a preferred embodiment, the clock generator is connected to the start circuit in such a manner that the initialization signal for the start circuit is sent to the clock generator, where it is processed further.

A preferred embodiment provides that the ring oscillator of the timing generator has at least five delay elements or delay members, further preferably at least 7 delay elements, very preferably at least 11 delay elements, and also very preferably at least 15 delay elements. In practical application, it was found that for many cases a ring oscillator with exactly 7 delay elements is preferred. When a 350 nm technology with a system clock of 200 MHz is used, with this arrangement, i.e., 7 delay elements in the ring oscillator, it is possible to generate time steps of 715 picoseconds.

A preferred embodiment of the timing generator provides that a load, preferably exactly one load, is present at each delay output of the ring oscillator. Particularly preferably, the load present at each delay output of the ring oscillator is constant. Also preferably, the loads each have the same value.

In the following text, an exemplary embodiment of the invention will be described with reference to the accompanying figures. In the figures.

Figure 1:
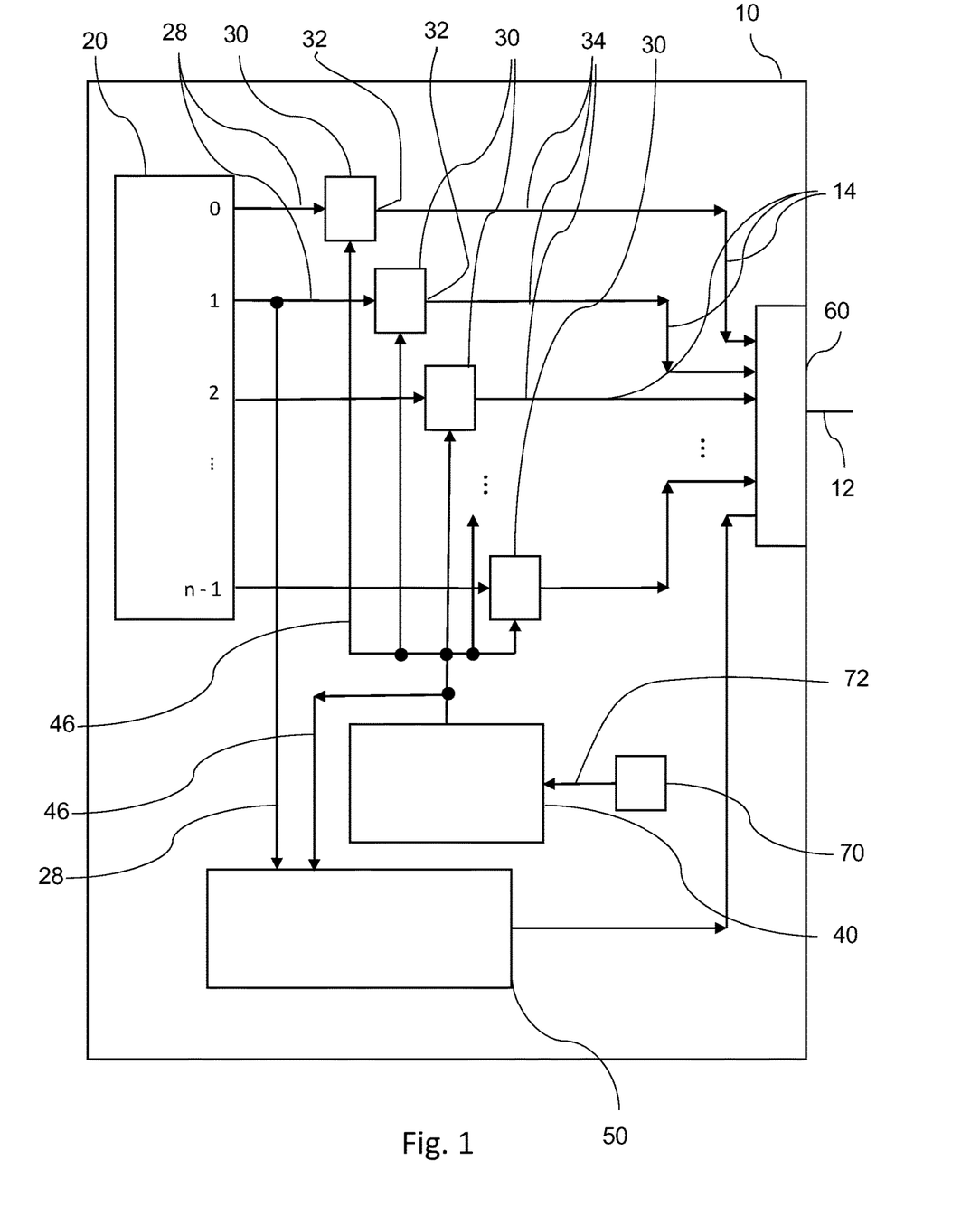
FIG. 1 shows a schematic representation of a timing generator according to the invention as master clock for an electronic circuit.

FIG. 1 shows a timing generator 10 as master clock for an electronic circuit that generates a timestamp which comprises a coarse code and a plurality of fine codes. The timing generator 10 has a ring oscillator 20, a plurality of clock dividers 30, a start circuit 40 and a clock generator 50, and also an output 60, at which the generated timestamp is present and is output to an electronic circuit.

Figure 4:
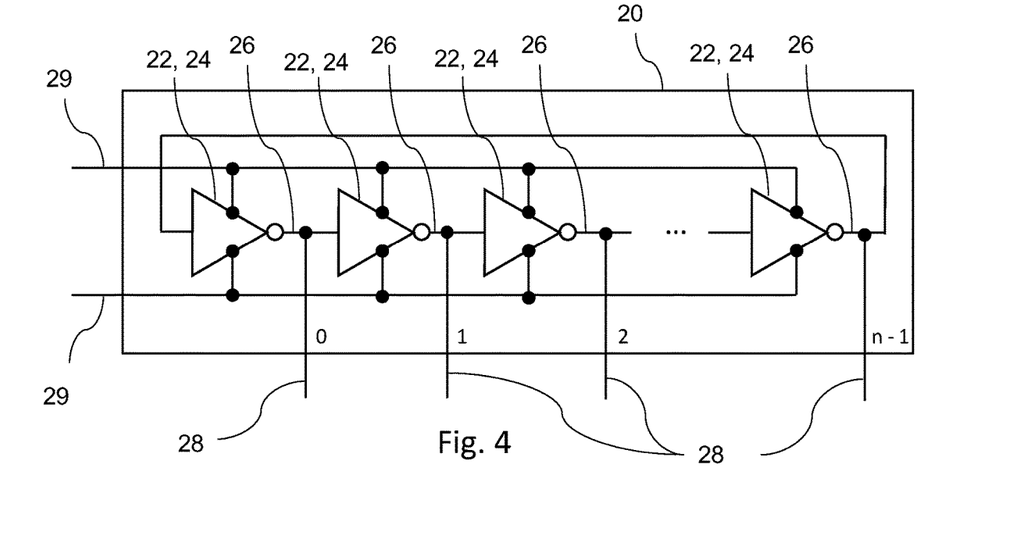
FIG. 4 shows an embodiment of a ring oscillator of the timing generator of FIG. 1.

The ring oscillator 20 has an uneven number n of delay elements 22, as are shown for example in FIG. 4. The delay elements 22 are preferably inverters 24 or inverter modules, which are interconnected in a ring. Each of the delay elements 22 has a delay output 26. A clock signal 28 is present at each delay output 26. Each of the n delay outputs 26 of the ring oscillator 20 is connected to a respective clock divider 30. The clock dividers 30, which are supplied with the dock signal 28 of a delay element 22, are each fed and controlled by an initialization signal 46 of the start circuit 40. Each clock divider 30 has a clock divider output 32, at which a clock divider output signal 34 is output. The clock divider output signal forms a fine code 14 of the timestamp 12, which is generated in the timing generator 10 and output at the output 60 thereof.

Accordingly, by means of the circuit of the present timing generator 10, n clock divider output signals 34 are generated, and therewith also n fine codes 14, which are part of the timestamp 12. The total of n clock dividers 30, to which the initialization signal 46 is transmitted, are thus triggered by means of the initialization signal 46 of the start circuit 40. This brings each clock divider output 32 of the clock dividers 30 into a defined state and holds said state. This corresponds to the possibility of performing an asynchronous reset.

The initialization signal generated in the start circuit 40 is not only transmitted to the clock dividers 30, but also to the clock generator 50. The clock generator 50 receives one of the clock signals of the ring oscillator 20 as a further input signal. The clock generator 50 is preferably fed with the clock signal of the second delay element 22 of the ring oscillator 20. Since the delay elements 22 are typically inverters, the signal is inverted at each of their outputs. By appropriately selecting the delay output 26 of the second inverter 24, a non-inverted clock signal is therefore preferably used to feed the clock generator. The clock signal is not inverted, because inverting it twice restores it to the non-inverted state.

A coarse code 16 is generated by means of the clock generator 50 and the signals (clock signal 28 and initialization signal 46 of the start circuit 40) present at its inputs. The coarse code is fed to the output 60 together with the fine codes 14, and is part of the timestamp 12 that is output at output 60.

The start circuit 40 is initiated by a start signal 72, which in a preferred embodiment may be provided by a start signal unit 70. In another preferred embodiment, the start signal unit 70 is not part of the timing generator 10, as shown here. Instead, the start signal 72 may be an input signal coming from outside the timing generator 10. This may be, for example, a global reset signal, which is used for the entire timing generator, and in practical embodiments may also appear and be processed at other locations. This global reset signal or start signal 72 serves to activate the start circuit, for example when the supply voltage has been powered up in good order on the ICs, and the ring oscillator 20 has been adjusted up to the correct frequency.

Figure 2:
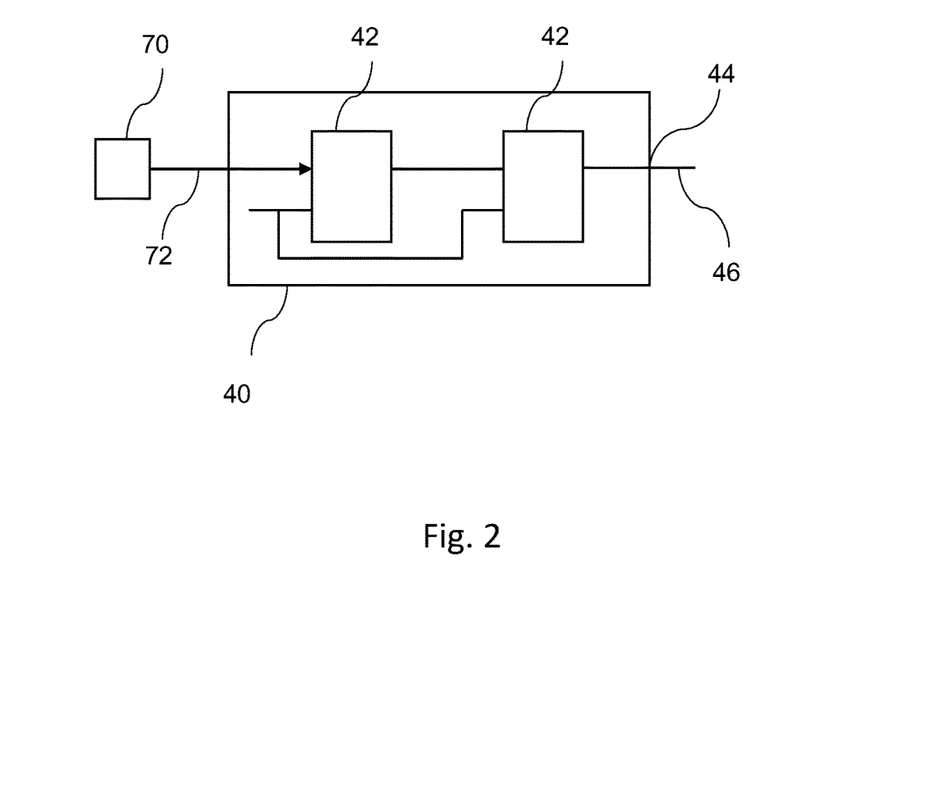
FIG. 2 shows a start circuit of the master clock of FIG. 1.

FIG. 2 shows a schematic diagram of start circuit 40 with the external start signal unit 70, which provides the start signal 72. The start circuit 40 comprises two flip-flop modules 42 connected in series, wherein at least one of the two flip-flops 42 might also be a memory module. The start circuit preferably includes exactly one memory module for each clock divider 30. The initialization signal is output at the output 44 of start circuit 40, and is made available to the clock dividers 30 and the clock generator 50.

In a preferred embodiment, the start circuit can also be supplied with the n clock signals 28 as well. In this preferred case, the start circuit 40 generates n phase-shifted derived initialization signals. These derived initialization signals switch in a certain sequence and a correct phasing relative to the clock signals 28. In other words, the first clock signal is in a defined phase relative to the first initialization signal, the second clock signal is in a defined phase relative to the second initialization signal, and so on, and the n-th clock signal is in a defined phase relative to the n-th initialization signal. Two different initialization signals preferably switched in a defined sequence. Both together, they guarantee that the clock dividers 30 always start in the correct phasing with respect to each other.

The start circuit preferably generates a plurality of initialization signals 46, particularly preferably in a defined sequence, so that the phase relationship between the clock dividers 30 is always identical. It is also preferable that the initialization signals 46 are independent of the state of the ring oscillator 20 at the time point when the start signal is present.

Figure 3:
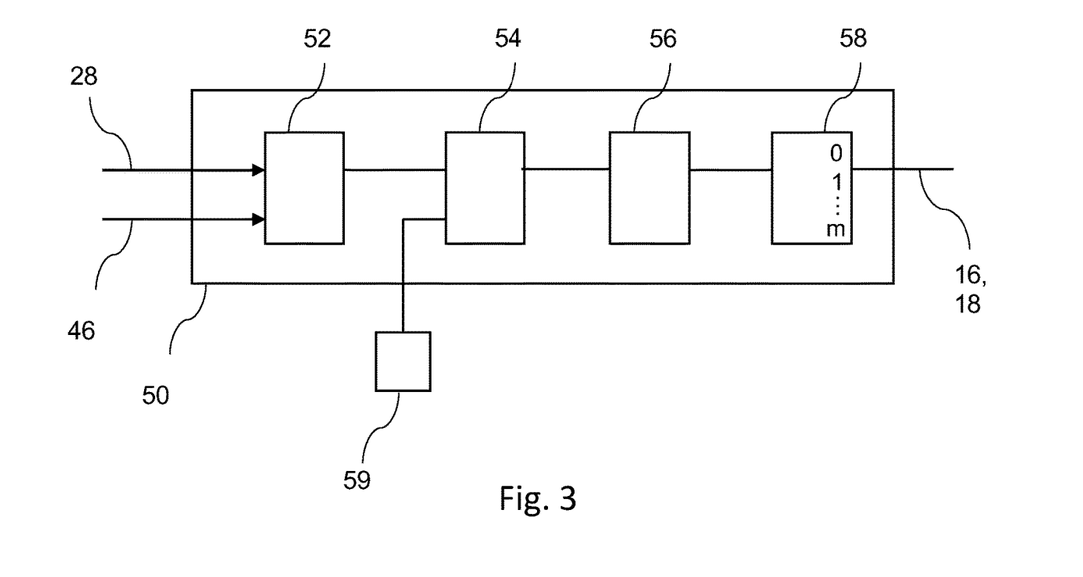
FIG. 3 shows a clock generator of the timing generator of FIG. 1.

FIG. 3 shows a preferred embodiment of the dock generator 50, which comprises a synchronous module 52, a clock-gate module 54, a counter 56 and a Gray code generator 58.

The clock signal 28 of the second delay output 26 of the ring oscillator 20 and the initialization signal 46 of the start circuit 40 are fed to the synchronous module, where they are processed further. The coarse code 16, which is generated in the clock generator 50 in the form of a Gray code 18, is present at the output of the clock generator 50. The Gray code 18 comprises a binary sequence, which is generated in the Gray code generator 58.

The Gray code generator 58 may preferably generate a multiplicity of Gray codes, preferably 2m Gray codes, wherein m is a natural number. Preferably, $2^{(n-1)}$ Gray codes are generated in the Gray code generator 58. The Gray codes 18 are generated by the Gray code generator 58 together with the counter 56.

The cycle length of the fine codes 14 is preferably equal to the cycle length of two Gray codes.

The clock-gate module 54 of the clock generator 50 is initiated by means of a switch signal, which is preferably designated as a start-of-measurement signal (SOM signal). The start-of-measurement signal can be generated in a corresponding SOM unit 59.

In FIG. 4, which shows an embodiment of the ring oscillator 20, it can be seen that the delay elements 22 or inverters 24 are controlled by two control voltages 29. These control voltages are generated by an external circuit (not shown), for example a phase-locked loop circuit.

As soon as the ring oscillator 20 is supplied with a supply voltage (not shown here), it starts up. Then it is adjusted to the correct frequency by means of the two control voltages 29. The ring oscillator 20 must have reached the defined frequency before the circuit is started. As soon as the frequency is reached, the start signal 72 from the start signal unit 70 is sent to the start circuit 40, and the dock dividers 30 are activated via the optional but preferred reset signals. The dock dividers 30 may also be frequency dividers. From this time point on, the fine code of the timestamp runs continuously through the 2×n states of the fine codes 14 of timestamp 12.

In a particularly preferred embodiment, the ring oscillator comprises seven delay elements. In this case, a fine code 14 is generated from seven clock divider output signals 34. In total, the fine code can thus assume fourteen states, since each clock divider output signal 34 can assume the state 0 or 1.

At this time point, the timing generator 10 is ready to generate timestamps. The one-time "start-up sequence" has been completed. Now a defined sequence of time stamps is generated via the start-of-measurement signal from the SOM unit 59 upon receipt of a command from outside. The start and end states as well as the sequence are always identical. The start-of-measurement signal is used to start the clock generator 50 for the coarse code 16. Since the fine code is running continuously through its 2× n states, as mentioned earlier, the clock generator (sometimes also called the coarse counter circuit) must also switch and start the counter 56 in a desired manner. The Gray code generator 58 must preferably be started in such a manner that a Gray code of Gray(0)=0000000(binary) starts exactly when the fine code or fine codes provided by the timing generator 10 are also binary 0, i.e. F=0000000(binary).

Figure 5A:
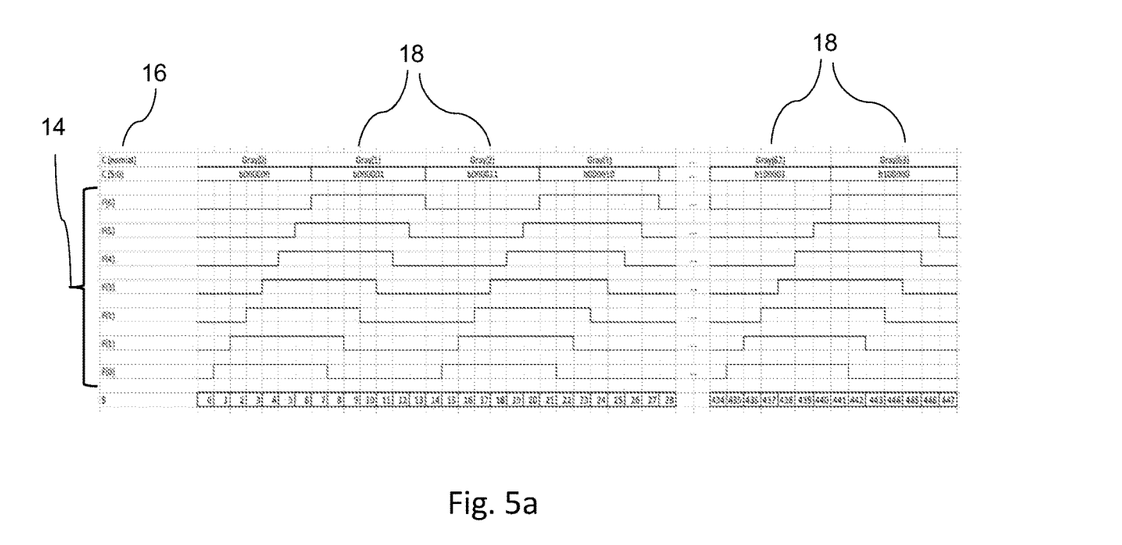
FIG. 5a-5c shows a timing diagram of coarse code and fine codes of a generated timestamp with various phasings.

After the clock generator 50 has started correctly, the coarse code and fine code sequence begins, as shown in the timing diagram in FIG. 5a. The coarse code cycles through $2^{(n-1)}$ states, in the present case therefore $2^6$=64 states. The fine code cycles multiple times through its fourteen possible. Since redundancy requires that two coarse code states are required for each cycle through the fine code state, a total of 64/2×14=448 unique combinations (Gray(0), . . . , Gray(63)) are generated. The respective binary code (b0000000, . . . , b1000000) is shown below the Gray codes 18 in the second row of the timing diagram in FIGS. 5a to 5c. The "first" coarse code with Gray(0) follows on again from the "last" coarse code with Gray(63) (shown in FIG. 5a).

Figure 5B:
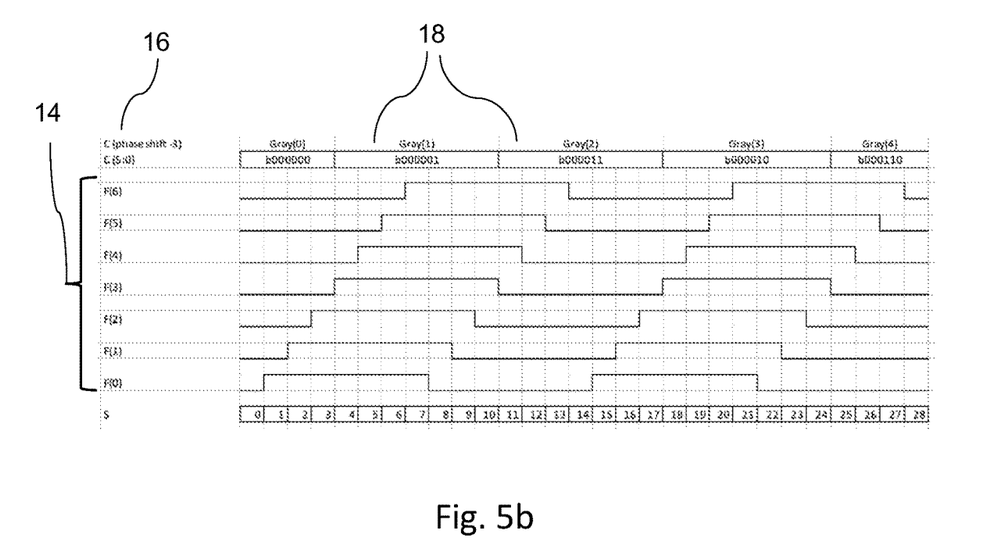
Figure 5C:
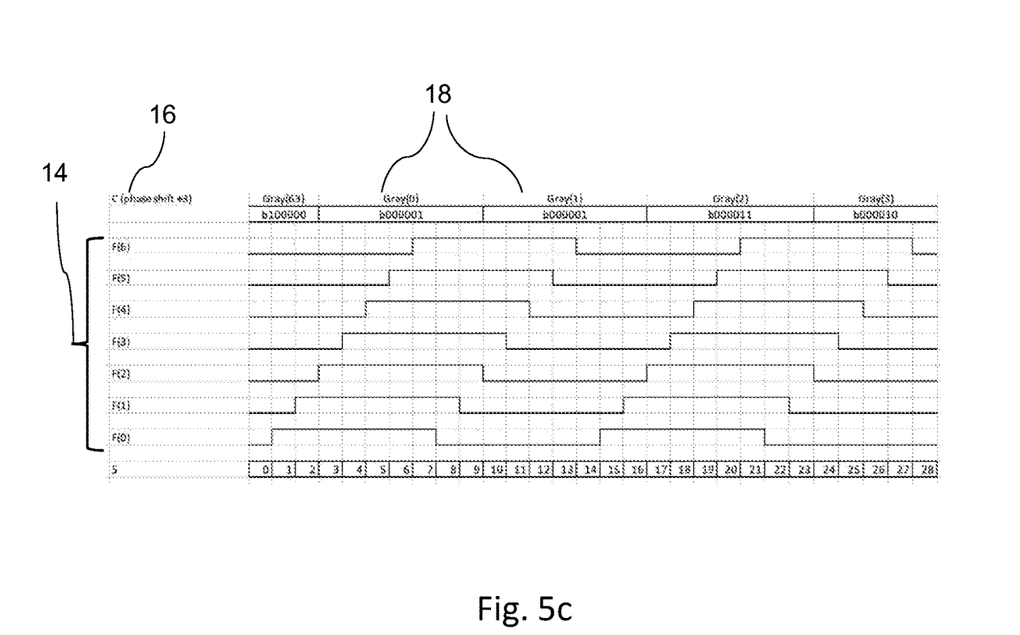

FIGS. 5b and 5c show the timestamp with a phase difference of the fine codes of (−3) or (+3) time steps with respect to the coarse code. The timing diagrams in FIGS. 5b and 5c show that there is one uniquely defined fine code and two uniquely defined coarse codes for each value S of the timestamp. Thus for example a combination of fine code equal to 0000111 with coarse code equal to 000001 or equal to 000000 returns a value S of the timestamp of S=3. No other combination of fine codes and coarse codes yields the value S=3 for the timestamp. This means that the fine code can be uniquely determined from the timestamp.

The last line of the respective timing diagrams in FIGS. 5a to 5c indicates the respective decoded value S of the timestamp at a certain time point.

Accordingly, the rising edge of the start-of-measurement signal causes the generation of a sequence of 448 time-stamps. In a time-of-flight measurement, therefore, the start-of-measurement signal starts the measurement so that the corresponding timestamp 0 is generated at time point t0.

Thus, with seven inverters 24 in the ring oscillator 20, the timestamp 12 comprises exactly 6 bits of coarse code 16 and 7 bits of fine code 14, which may be distributed across the entire integrated circuit or entire circuitry.

The asynchronous SRAM control, for example, for lidar circuits thus receives exactly this 6+7 bit timestamp and uses it to generate the address for a memory, or the like.

The start-of-measurement signal which initiates the clock generator 50 thus serves to synchronize the coarse code with the fine code.

The clock-gate module 54 shown in FIG. 3 comprises for example a flip-flop module, preferably a synchronous flip-flop module.

The timing generator 10 according to the invention has the advantage that the length of the ring oscillator 20, i.e. the number of delay elements 22, is independent of the length of the Gray code. The counter 56 in the clock generator may be a quite normal clocked digital counter. It switches to the next state with each clock pulse. However, as a standard digital circuit, the switching time of the digital counter 56 is tied to the technology in which it was produced. In a 350 nm technology typically used in automobile manufacturing, the digital counter is not able to switch at more than 200 MHz. This corresponds to a 5 ns increment for the timestamp. In order to achieve a higher resolution, the counter 56 is supplied from the ring oscillator 20, in which the clock signal 28 is fed to the clock generator 50. The ring oscillator 20 has the useful property of generating a number of n phase-shifted pulses for n delay elements 22. The phase difference of the pulses is equal to the period p divided by the number of delay elements n, i.e. p/n. Consequently, for a ring oscillator 20 with seven delay elements 22 and one clock divider 30 each at 200 MHz, corresponding to a 5 ns increment, the phase difference is 715 picoseconds.

Taking into account all seven outputs of the clock dividers 30, a unique sequence of states is obtained which changes every 715 picoseconds. It may therefore be said that a "fine interpolation" is carried out between two pulse edges. The code or timestamp thus obtained in the present example with seven delay elements in the ring oscillator looks like this:

0000000→0000001→0000011→0000111→ . . . →1111111→1111110→1111100→ . . . →1000000

The timing generator according to the invention has the advantage that the timestamp 12 can be sampled at any time point with an error or inaccuracy of not more than one time step or not more than one least significant bit (LSB).

The least significant bit is the value from one binary code to the next in the timestamp, i.e., the smallest codable increment the timestamp 12 can have.

Sampling is normally performed in such a manner that the fine code has already assumed its new output state before the coarse code switches, causing the Gray code in the coarse code to change. In this case, a maximum error of 1 bit may occur. Sampling can also be performed even when the timestamp is changing from one state to the next. This is the case with a pure coarse code or Gray code, for example, since only 1 bit ever changes. The Gray code is shifted by a maximum of 1 bit. With a pure fine code as well, only 1 bit changes from one state to the next in each case. However, this is not the case for the timestamp 12 and its binary code that consists of coarse code and fine codes. For example, assuming a three-digit binary code, the binary sequence 011 (=3) for example may change to the binary sequence 100 (=4) in the next step. But in practice all bits can never change at exactly the same time, so errors can in principle occur when sampling the timestamp at the moment of switching. For example, if the highest bit in the example above changed a little faster and switching took place a little earlier, bit sequence 011(=3) is initially followed by bit sequence 111(=7), and bit sequence 100(=4) does only appear in the next step. In the short term, therefore, the error is a maximum of 4 decimal steps (7−3=4). If two parts of the code are considered, each of which has the characteristic that only 1 bit changes from one value to the next, this characteristic is no longer fulfilled for the combination. The combined timestamp 12 can only be sampled again at any time point with a maximum error of one time step or one LSB because of the redundancy according to the invention of the timing generator according to the invention.

Due to the combination of fine code and coarse code in the timestamp according to the invention, and the fact that the time difference of the fine codes 14 depends only on the number n of delay elements 22 of the ring oscillator and their delay time, a maximum error of one time step can be guaranteed. Using the redundant information contained in the coarse code 16 and the fine codes 14, a temporal shift of the fine codes up to a maximum of (n−1)/2 time differences relative to the coarse code is possible and still results in a correct timestamp 12. In the case of seven delay elements 22 in the ring oscillator 20, shifts between fine code and coarse code by up to a maximum of ±three time differences are acceptable without the timestamp 12, that is output, being erroneous. Accordingly, the timing generator 10 is very robust and can be used in many applications.

FIG. 6 again shows a schematic diagram of the method according to the invention for generating a timestamp 12 as master clock (timer) for an electronic circuit. In a first step S10, an uneven number n of clock signals 28 with a time difference relative to each other is generated. The generation is preferably performed by means of a ring oscillator 20 with n delay elements 22. In a further step 312, each clock signal 28 is supplied to a clock divider 30 for dividing the clock signal frequency and generating a fine code 14 in each case, in such a manner that two fine codes 14 are shifted with respect to each other by a time difference. A step 314 of generating an initialization signal 46 follows. A further step 316 of sending the initialization signal 46 provides for transmitting the initialization signal 46 to each of the clock dividers 30, to initiate an enabling of the clock dividers 30.

Figure 6:
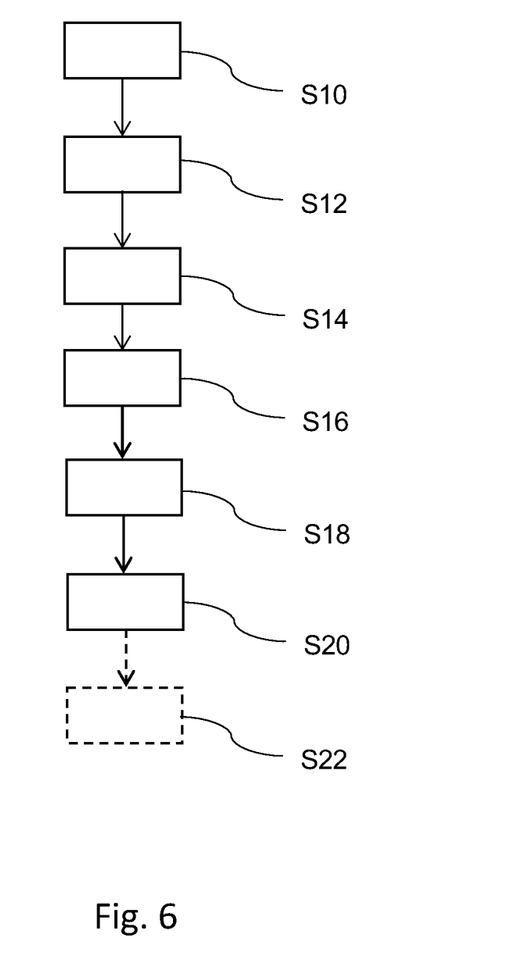
FIG. 6 shows a schematic flowchart of the method according to the invention for generating a timestamp as master clock for an electronic circuit.

A further method step 318 of generating a coarse code 16 from one of the clock signals 28 takes place as soon as the start-of-measurement signal of the SOM unit 59 is sent. In a further step S20 of generating a timestamp 12, the timestamp 12 is generated from the coarse code 16 and a plurality of fine codes 14 in such a manner that the coarse code 16 and the fine codes 14 contain redundant information. The redundant information of the timestamp 12 is designed such that even a time shift of the fine codes 14 with respect to the coarse code 16 by up to (n−1)/2 time differences still results in a correct and error-free timestamp 12. In this context, n is the number of delay elements 22 provided in the ring oscillator 20.

A preferred embodiment of the method provides an optional step S22, in which an initialization signal 46 is generated for each of the dock dividers 30 and is distributed to the corresponding dock dividers,

The invention claimed is:

1. A timing generator as master clock for an electronic circuit, wherein the timing generator is arranged and configured to generate a timestamp that comprises a coarse code and a plurality of fine codes, comprising:
 a ring oscillator with an uneven number n of delay elements, each with one delay output at which a clock signal is present, wherein each delay element is adjusted to a preset delay time;
 clock dividers, arranged at and connected to a delay output in such a manner that each delay output is connected to a clock divider, wherein the clock dividers have a clock divider output at which a clock divider output signal is output;
 a start circuit for generating an initialization signal, which is transmitted to each clock divider to trigger the clock divider, in order to place the clock divider output in a defined state and maintain it there;
 a clock generator, which is connected to a delay output and processes the clock signal further to generate the coarse code therefrom; and
 an output at which the generated timestamp is output; wherein
 the clock divider output signals from two clock dividers are shifted with respect to each other by a time difference;
 the fine codes are formed from the clock divider output signals of the clock dividers;
 the time difference of the fine codes depends on the number n and delay time of the delay elements;
 the timestamp is formed from the fine codes and the coarse code;
 the coarse code and the fine codes comprise redundant information in such a manner that a time shift of the fine codes with respect to a coarse code by a maximum of (n−1)/2 time differences results in a correct timestamp.

2. The timing generator of claim 1, wherein the clock generator comprises a synchronous module, a clock-gate module, a counter and a Gray code generator.

3. The timing generator of claim 2, wherein the Gray code generator generates $2^m$ Gray codes, where m is not equal to n.

4. The timing generator of claim 2, wherein the Gray code generator generates $2^{(n-1)}$ Gray codes.

5. The timing generator of claim 2, wherein the coarse code comprises a Gray code, which is generated by means of the Gray code generator.

6. The timing generator of claim 3, wherein the cycle length of the fine codes is equal to the cycle length of two Gray codes.

7. The timing generator of claim 2, wherein the clock-gate module of the clock generator is initiated by means of a switch signal, which is a start-of-measurement signal, to synchronize the coarse code with the fine code.

8. The timing generator of claim 2, wherein the clock-gate module comprises a flip-flop-module.

9. The timing generator of claim 2, wherein the synchronous module comprises a flip-flop-module and an inverter module, and the initialization signal is transmitted to the synchronous module.

10. The timing generator of claim 1, wherein the timestamp can be sampled at any time point, and the correct time value of the timestamp can be determined with a maximum error of one time step.

11. The timing generator of claim 1, wherein the timestamp can be sampled with the maximum error while the value of the coarse code and/or fine code is changing from one state to the next.

12. The timing generator according to claim 1, wherein the timestamp is sampled with at least one flip-flop.

13. The timing generator according to claim 1, wherein the timestamp is sampled by a set of n+m flip-flops, wherein n is the number of delay elements and m is the number of Gray codes of the coarse code.

14. The timing generator of claim 1, wherein the delay elements of the ring oscillator are controlled to the predetermined delay time with a control voltage.

15. The timing generator of claim 1, wherein the start circuit comprises a memory module or a flip-flop-module or a bistable multivibrator circuit.

16. The timing generator of claim 1, wherein the start circuit generates for each clock divider an initialization signal having a fixed phase relationship to the clock of the clock divider.

17. The timing generator of claim 1, wherein the start circuit generates a plurality of initialization signals in such a manner that the phase relationship of the clock dividers is always identical.

18. The timing generator of claim 1, wherein the clock generator is connected to the start circuit in such a manner that the initialization signal is processed further in the clock generator.

19. The timing generator of claim 1, wherein the ring oscillator comprises at least five delay elements.

20. The timing generator of claim 1, wherein the ring oscillator comprises at least seven delay elements.

21. The timing generator of claim 1, wherein a load is present at each delay output of the ring oscillator.

22. A method for generating a timestamp as master clock for an electronic circuit, comprising the following steps:

generating an uneven number n of clock signals that are time delayed with respect to each other;

supplying each clock signal to a clock divider for dividing the frequency of the clock signal and for generating one fine code for each in such a manner that two fine codes are shifted by a time difference with respect to each other;

generating an initialization signal;

transmitting the initialization signal to each of the clock dividers for enabling the clock dividers;

generating a coarse code from one of the clock signals;

generating a timestamp from the coarse code and the plurality of fine codes, such that the coarse code and the fine codes have redundant information in such a manner that even a time shift of the fine codes by at most (n−1)/2 time differences with respect to a coarse code results in a correct timestamp.

\* \* \* \* \*